US011532544B2

(12) United States Patent
Ino

(10) Patent No.: US 11,532,544 B2
(45) Date of Patent: Dec. 20, 2022

(54) HIGH FREQUENCY MODULE HAVING POWER AMPLIFIER MOUNTED ON SUBSTRATE

(71) Applicant: Murata Manufacturing Co., Ltd., Kyoto (JP)

(72) Inventor: Yusuke Ino, Kyoto (JP)

(*) Notice: Subject to any disclaimer, the term of this patent is extended or adjusted under 35 U.S.C. 154(b) by 0 days.

(21) Appl. No.: 16/923,685

(22) Filed: Jul. 8, 2020

(65) Prior Publication Data

US 2020/0343172 A1 Oct. 29, 2020

Related U.S. Application Data

(63) Continuation of application No. PCT/JP2018/045429, filed on Dec. 11, 2018.

(30) Foreign Application Priority Data

Jan. 9, 2018 (JP) .............................. JP2018-001432

(51) Int. Cl.
*H01L 23/498* (2006.01)
*H01L 23/00* (2006.01)

(52) U.S. Cl.
CPC ........ *H01L 23/49844* (2013.01); *H01L 24/16* (2013.01); *H01L 2224/16227* (2013.01);
(Continued)

(58) Field of Classification Search
CPC ............... H01L 23/49844; H01L 24/16; H01L 2224/16227; H01L 2924/1305; H01L 2924/1421
(Continued)

(56) References Cited

U.S. PATENT DOCUMENTS 5,510,758 A 4/1996 Fujita et al.
2002/0015291 A1* 2/2002 Kohjiro ............. H01L 23/49838
361/760
(Continued)

FOREIGN PATENT DOCUMENTS

JP H0774285 A 3/1995
JP 2002134648 A 5/2002
(Continued)

OTHER PUBLICATIONS

International Search Report issued in Application No. PCT/JP2018/045429, dated Feb. 26, 20219.
(Continued)

*Primary Examiner* — Lex H Malsawma
*Assistant Examiner* — Laura M Dykes
(74) *Attorney, Agent, or Firm* — Pearne & Gordon LLP

(57) ABSTRACT

A high frequency module includes a power amplifier and a substrate on which the power amplifier is mounted. The power amplifier includes a first external terminal and a second external terminal formed on a mounting surface. The substrate includes a first land electrode and a second land electrode formed on one principal surface. The first external terminal is connected to the first land electrode, and the second external terminal is connected to the second land electrode. A distance from the mounting surface to a connection surface of the first external terminal is shorter than a distance from the mounting surface to a connection surface of the second external terminal, and a distance from a connection surface of the first land electrode to the one principal surface is longer than a distance from a connection surface of the second land electrode to the one principal surface.

18 Claims, 9 Drawing Sheets

(52) U.S. Cl.
CPC ............... *H01L 2924/1305* (2013.01); *H01L 2924/1421* (2013.01)

(58) Field of Classification Search
USPC ........................................... 257/668
See application file for complete search history.

(56) References Cited

U.S. PATENT DOCUMENTS

| | | | | |
|---|---|---|---|---|
| 2007/0181976 | A1* | 8/2007 | Toyoda | H01L 29/7378 |
| | | | | 257/565 |
| 2012/0043672 | A1* | 2/2012 | Cho | H01L 23/49822 |
| | | | | 257/E23.06 |
| 2013/0087910 | A1* | 4/2013 | Abdul Razak | H01L 24/16 |
| | | | | 257/737 |
| 2014/0151874 | A1 | 6/2014 | Obu et al. | |
| 2016/0322323 | A1* | 11/2016 | Lai | H01L 24/14 |
| 2018/0151495 | A1* | 5/2018 | Hsu | H01L 24/11 |
| 2019/0229194 | A1* | 7/2019 | Yoshida | H01L 29/4236 |

FOREIGN PATENT DOCUMENTS

| | | | |
|---|---|---|---|
| JP | 2007150335 A | | 6/2007 |
| JP | 2007194305 A | | 8/2007 |
| JP | 2008171879 A | * | 7/2008 |
| JP | 2008171879 A | | 7/2008 |
| JP | 2014132635 A | | 7/2014 |

OTHER PUBLICATIONS

Written Opinion issued in Application No. PCT/JP2018/045429, dated Feb. 26, 20219.

* cited by examiner

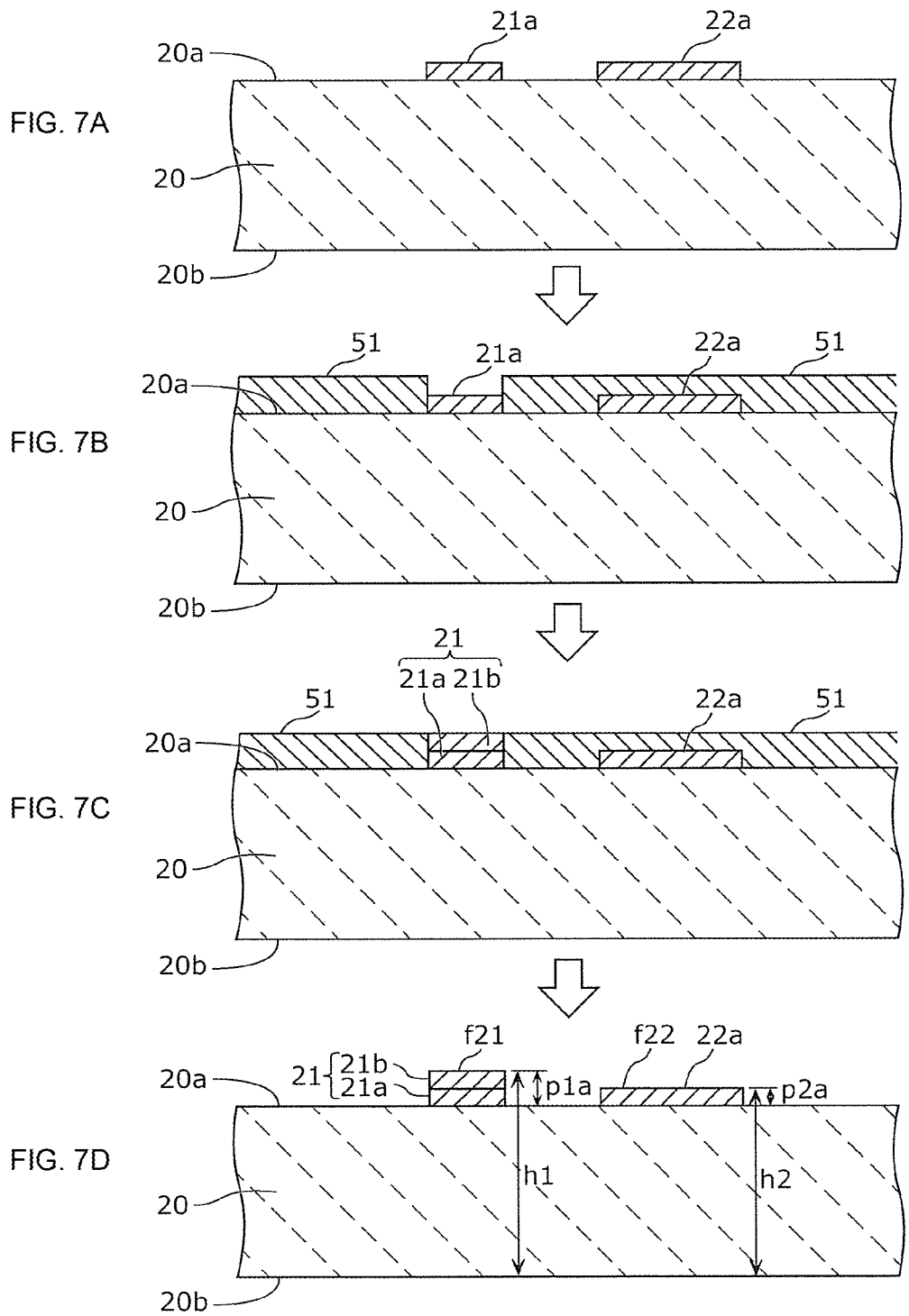

HIGH FREQUENCY MODULE HAVING POWER AMPLIFIER MOUNTED ON SUBSTRATE

This is a continuation of International Application No. PCT/JP2018/045429 filed on Dec. 11, 2018 which claims priority from Japanese Patent Application No. 2018-001432 filed on Jan. 9, 2018. The contents of these applications are incorporated herein by reference in their entireties.

BACKGROUND OF THE DISCLOSURE

1. Field of the Disclosure

The present disclosure relates to a high frequency module in which a power amplifier is mounted on a substrate.

2. Description of the Related Art

In general, high frequency modules each including a substrate and a power amplifier mounted on the substrate are known in the art. As an example of such power amplifiers, Japanese Unexamined Patent Application Publication No. 2014-132635 (patent document 1) discloses a power amplifier that includes a plurality of external terminals (pillars) having different cross-sectional areas. The patent document 1 also discloses that in the case where external terminals are formed by plating, the external terminal having a larger cross-sectional area has a higher height.

BRIEF SUMMARY OF THE DISCLOSURE

For example, as a part of the power amplifier such as the one illustrated in the patent document 1, an amplifying element is used in some cases. A large current flows through the amplifying element because of its amplifying operation, and thus heat is likely to be generated near certain external terminals (for example, a terminal on the drain side and a terminal on the source side) of the amplifying element. As a solution for this, it is conceivable to enlarge the cross-sectional area of the external terminal where heat is likely to be generated in order to increase heat dissipation capability. However, when the cross-sectional area of the external terminal where heat is likely to be generated is made larger than that of the other terminal (for example, a terminal on the gate side), the height of the external terminal where heat is likely to be generated may become higher than other external terminals in the case where the external terminals are grown by plating.

As described above, in the case where the external terminals having different heights are formed in the power amplifier and this power amplifier is mounted on a substrate, the connection between the external terminal having a lower height and a land electrode of the substrate may become insufficient, and this may cause failure of the mounting.

Accordingly, the present disclosure is made in view of such issues, and an object thereof is to provide a high frequency module capable of suppressing the occurrence of failure of the mounting.

In order to achieve the foregoing object, a high frequency module according to one aspect of the present disclosure is a high frequency module including a power amplifier and a substrate on which the power amplifier is mounted, wherein the power amplifier includes a mounting surface, a first external terminal, and a second external terminal, the first external terminal and the second external terminal being formed on the mounting surface, the substrate includes one principal surface, a first land electrode, and a second land electrode, the first land electrode and the second land electrode being formed on the one principal surface, the first external terminal is connected to the first land electrode, the second external terminal is connected to the second land electrode, a distance from the mounting surface to a connection surface of the first external terminal is shorter than a distance from the mounting surface to a connection surface of the second external terminal, and a distance from a connection surface of the first land electrode to the one principal surface is longer than a distance from a connection surface of the second land electrode to the one principal surface.

As described above, even in the case where the distance from the mounting surface to the connection surface of the first external terminal is shorter than the distance from the mounting surface to the connection surface of the second external terminal, by making the distance from the connection surface of the first land electrode to the one principal surface longer than the distance from the connection surface of the second land electrode to the foregoing one principal surface, a difference between the distance between the connection surfaces of the first external terminal and the first land electrode and the distance between the connection surfaces of the second external terminal and the second land electrode can be made smaller, and the failure of the mounting at the time of mounting the power amplifier on the substrate can be suppressed.

In order to achieve the foregoing object, a high frequency module according to one aspect of the present disclosure is a high frequency module including a power amplifier and a substrate on which the power amplifier is mounted, wherein the power amplifier includes a mounting surface, a first external terminal, and a second external terminal, the first external terminal and the second external terminal being formed on the mounting surface, the substrate includes one principal surface, a first land electrode, and a second land electrode, the first land electrode and the second land electrode being formed on the one principal surface, the first external terminal is connected to the first land electrode, the second external terminal is connected to the second land electrode, a distance from the mounting surface to a connection surface of the first external terminal is shorter than a distance from the mounting surface to a connection surface of the second external terminal, and a distance from another principal surface of the substrate to a connection surface of the first land electrode is longer than a distance from the another principal surface to a connection surface of the second land electrode.

As described above, even in the case where the distance from the mounting surface to the connection surface of the first external terminal is shorter than the distance from the mounting surface to the connection surface of the second external terminal, by making the distance from the another principal surface of the substrate to the connection surface of the first land electrode longer than the distance from the foregoing another principal surface to the connection surface of the second land electrode, a difference between the distance between the connection surfaces of the first external terminal and the first land electrode and the distance between the connection surfaces of the second external terminal and the second land electrode can be made smaller, and the failure of the mounting at the time of mounting the power amplifier on the substrate can be suppressed.

Further, when the power amplifier is viewed from a direction vertical to the mounting surface, an area of the second external terminal may be larger than an area of the first external terminal.

This enables to increase heat dissipation capability for heat generated from the second external terminal close to a heat generation source of the amplifying element and to improve reliability against heat of the power amplifier.

Further, when the power amplifier is viewed from a direction vertical to the mounting surface, the second external terminal may have a rectangular shape, and the first external terminal may have a circular shape.

This enables to increase the heat dissipation capability of the power amplifier using simple shapes and reduce the area of the power amplifier.

Further, when the power amplifier is viewed from a direction vertical to the mounting surface, a dimension of the long side of the second external terminal may be larger than a dimension of diameter of the first external terminal, and a dimension of the short side of the second external terminal may be equal to the dimension of diameter of the first external terminal.

As described above, by making the dimension of long side of the second external terminal larger than the dimension of diameter of the first external terminal, the heat dissipation capability of the power amplifier can be increased. Further, by making the dimension of the short side of the second external terminal equal to the dimension of diameter of the first external terminal, the area of the power amplifier can be reduced.

Further, the first external terminal and the second external terminal may be electrodes grown by plating and may contain a same metallic material.

Even in the case where the first external terminal and the second external terminal are grown by plating in such a manner as to have different protruding distances from the mounting surface, the first land electrode and the second land electrode are provided in such a manner as to compensate the difference between the protruding distances, and thus the occurrence of failure of the mounting can be suppressed.

Further, when the substrate is viewed from a direction vertical to the foregoing one principal surface, an area of the second land electrode may be larger than an area of the first land electrode.

This enables to increase heat receiving capability of the second land electrode of the substrate and improve reliability against heat of the power amplifier.

Further, when the substrate is viewed from a direction vertical to the foregoing one principal surface, the second land electrode may have a rectangular shape, and the first land electrode may have a circular shape.

This enables to increase the heat dissipation capability of the power amplifier using simple shapes and reduce the area of the power amplifier.

Further, each of the first land electrode and the second land electrode may include one or more layers of electrodes, and a number of layers included in the first land electrode may be larger than a number of layers included in the second land electrode.

This enables to form the first land electrode higher than the second land electrode. Accordingly, a difference between the distance between the connection surfaces of the first external terminal and the first land electrode and the distance between the connection surfaces of the second external terminal and the second land electrode can be made smaller, and the occurrence of failure of the mounting can be suppressed.

Further, the substrate may be made of an ultraviolet curable material or a light curable material.

This enables to form the first land electrode and the second land electrode with a high degree of accuracy. Accordingly, a difference between the distance between the connection surfaces of the first external terminal and the first land electrode and the distance between the connection surfaces of the second external terminal and the second land electrode can be made smaller with a high degree of accuracy, and the occurrence of failure of the mounting can be suppressed.

Further, the power amplifier may include one or more amplifying elements, the amplifying element may include an input terminal to which a high frequency signal is input, an output terminal from which the high frequency signal is output, a first terminal, and a second terminal, the amplifying element may amplify a high frequency signal inputted to the input terminal and outputs an amplified high frequency signal to the output terminal, and may control a current flowing between the first terminal and the second terminal using a bias voltage applied to the amplifying element, at least one of one or more of the input terminals included in the one or more amplifying elements may be connected to the first external terminal via a wiring line inside the power amplifier, and the first terminal and the second terminal may be connected to a plurality of the second external terminals via wiring lines inside the power amplifier, respectively.

As described above, in the power amplifier in which the first terminal and the second terminal, across which a bias voltage is applied, are connected to the respective ones of the plurality of the second external terminals, in order to promote the dissipation of heat generated near the first terminal and the second terminal, the cross-sectional areas of the plurality of the second external terminals are made larger in some cases, for example. Because of this, for example, in the case where the plurality of the second external terminals are grown by plating, the length of the second external terminal measured using the mounting surface as a reference become longer while the length of the first external terminal becomes shorter in some cases. On the other hand, in the present disclosure, the difference between the distance between the connection surfaces of the first external terminal and the first land electrode and the distance between the connection surfaces of the second external terminal and the second land electrode can be made smaller by making the distance from the connection surface of the first land electrode to the one principal surface longer than the distance from the connection surface of the second land electrode to the foregoing one principal surface. This enables to suppress the failure of the mounting at the time of mounting the power amplifier on the substrate.

Further, the amplifying element may be a field-effect transistor, the input terminal may be a terminal on a gate side of the field-effect transistor, the first terminal may be a terminal on a drain side of the field-effect transistor, and the second terminal may be a terminal on a source side of the field-effect transistor.

This enables to increase the heat dissipation capability for heat generated at the field-effect transistor while suppressing the occurrence of failure of the mounting.

Further, the amplifying element may be a field-effect transistor, the input terminal may be a terminal on a base side of the bipolar transistor, the first terminal may be a terminal on a collector side of the bipolar transistor, and the second terminal may be a terminal on an emitter side of the bipolar transistor.

This enables to increase the heat dissipation capability for heat generated at the bipolar transistor while suppressing the occurrence of failure of the mounting.

Furthermore, the power amplifier may further include at least one third external terminal provided on the mounting surface that faces the substrate, at least one of one or more of the output terminals included in the one or more amplifying elements may be connected to the third external terminal via a wiring line inside the power amplifier, the substrate may further include at least one third land electrode provided on the one principal surface of the substrate, the third external terminal may be connected to the third land electrode, a distance from the mounting surface to a connection surface of the third external terminal may be longer than a distance from the mounting surface to a connection surface of the first external terminal, and a distance from a connection surface of the third land electrode to the one principal surface may be shorter than a distance from a connection surface of the first land electrode to the one principal surface.

As described above, even in the case where the distance from the mounting surface to the connection surface of the third external terminal is longer than the distance from the mounting surface to the connection surface of the first external terminal, by making the distance from the connection surface of the third land electrode to the one principal surface shorter than the distance from the connection surface of the first land electrode to the foregoing one principal surface, a difference between the distance between the connection surfaces of the first external terminal and the first land electrode and the distance between the connection surfaces of the third external terminal and the third land electrode can be made smaller. This enables to suppress the failure of the mounting at the time of mounting the power amplifier on the substrate.

Furthermore, the power amplifier may further include at least one third external terminal provided on the mounting surface that faces the substrate, at least one of one or more of the output terminals included in the one or more amplifying elements may be connected to the third external terminal via a wiring line inside the power amplifier, the substrate further may include at least one third land electrode provided on the one principal surface of the substrate, the third external terminal may be connected to the third land electrode, a distance from the mounting surface to a connection surface of the third external terminal may be longer than a distance from the mounting surface to a connection surface of the first external terminal, and a distance from another principal surface of the substrate to a connection surface of the third land electrode may be shorter than a distance from the another principal surface to the connection surface of the first land electrode.

As described above, even in the case where the distance from the mounting surface to the connection surface of the third external terminal is longer than the distance from the mounting surface to the connection surface of the first external terminal, by making the distance from the another principal surface of the substrate to the connection surface of the third land electrode shorter than the distance from the another principal surface to a connection surface of the first land electrode, a difference between the distance between the connection surfaces of the first external terminal and the first land electrode and the distance between the connection surfaces of the third external terminal and the third land electrode can be made smaller. This enables to suppress the failure of the mounting at the time of mounting the power amplifier on the substrate.

Further, a groove-like depression may be provided along an outer perimeter of the second land electrode of the substrate.

This enables to keep an excessive amount of a joining material at the time of mounting within the foregoing depression and prevent the joining material, which connects the second external terminal and the second land electrode, from being connected with an adjacent external terminal.

Further, a groove-like depression may be provided along an outer perimeter of the first land electrode of the substrate.

This enables to keep an excessive amount of a joining material at the time of mounting within the foregoing depression and prevent the joining material, which connects the first external terminal and the first land electrode, from being connected with an adjacent external terminal.

Other features, elements, characteristics, and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIGS. 7A to 7D are diagrams illustrating a fabrication method of land electrodes of the substrate in the high frequency module according to the embodiment 1;

DETAILED DESCRIPTION OF THE DISCLOSURE

Hereinafter, high frequency modules according to embodiments of the present disclosure will be described in detail with reference to the drawings. It should be noted that embodiments which will be described below each illustrate a preferred specific example of the present disclosure. Numeric values, shapes, materials, constituting elements, arrangement positions and connection modes of the constituting elements, steps, sequences of the steps, and the like illustrated in the following embodiments are mere examples, and not intended to limit the present disclosure. Further, of constituting elements in the following embodiments, constituting elements that are not described in an independent claim representing the broadest concept of the present disclosure will be described as optional constituting elements that constitute more preferred embodiments.

Embodiment 1

1-1. Configuration of High Frequency Module

Referring to FIG. 1 to FIG. 5, the configuration of a high frequency module according to the present embodiment is described.

Figure 1:
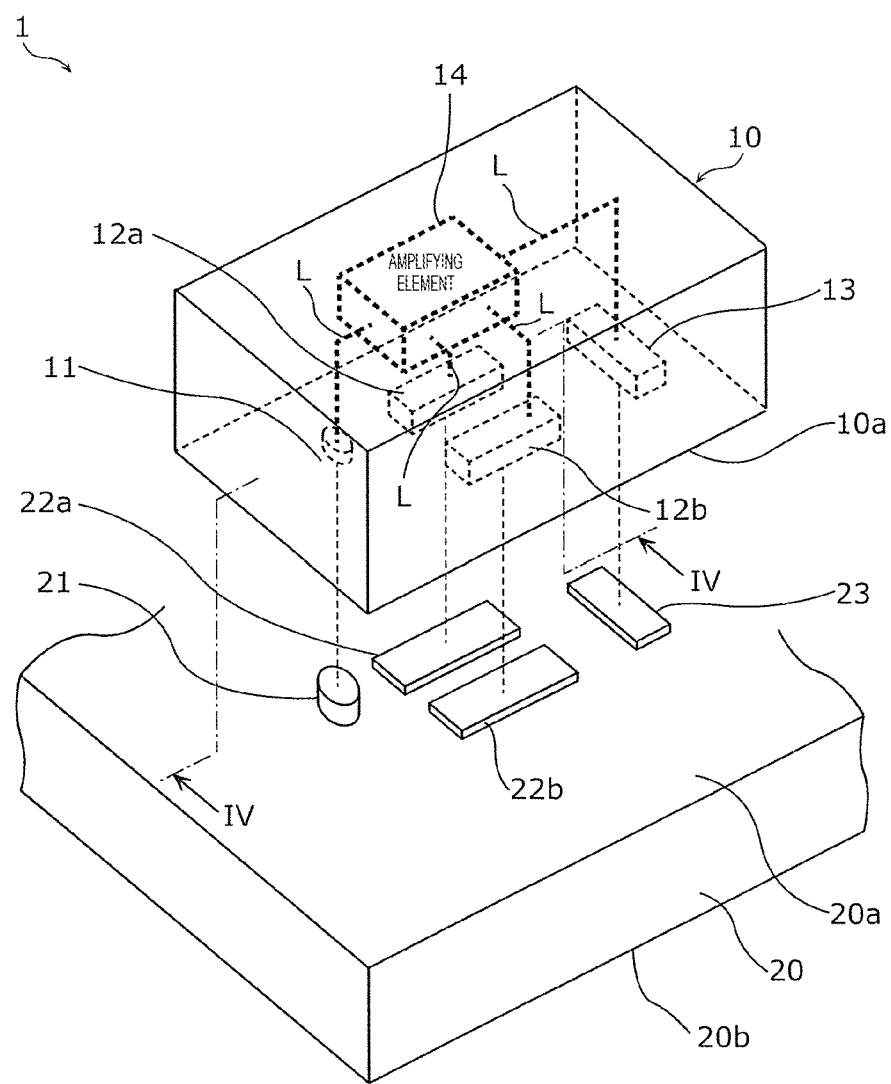
FIG. 1 is an exploded perspective view of a power amplifier and a substrate of a high frequency module according to an embodiment 1.

FIG. 1 is an exploded perspective view of a power amplifier 10 and a substrate 20 of a high frequency module 1 according to the embodiment 1. The high frequency module 1 includes the power amplifier 10 including an amplifying element 14 and the substrate 20 on which the power amplifier 10 is mounted. The power amplifier 10 and the substrate 20 are connected using, for example, a joining material such as solder or the like.

The substrate 20 includes one principal surface 20a and the other principal surface 20b on the side opposite the one principal surface 20a. A first land electrode 21, a plurality of second land electrodes 22a and 22b, and a third land electrode 23 are provided on the one principal surface 20a of the substrate 20. The substrate 20 contains an ultraviolet curable material or a light curable material and is formed using a semiconductor process such as a photolithography method and the like.

Figure 2:
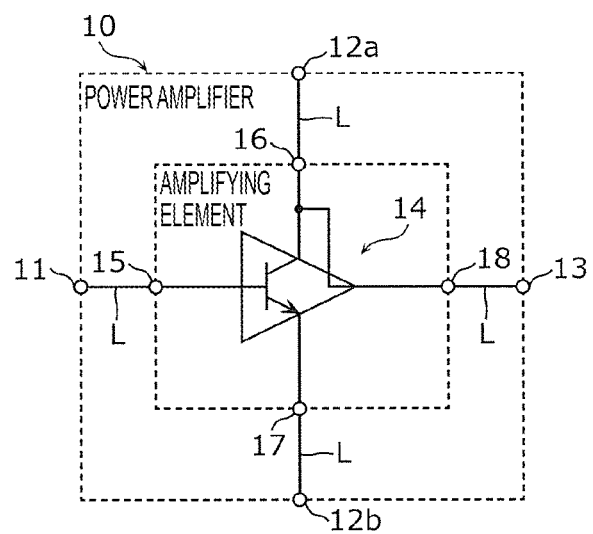
FIG. 2 is a circuit diagram illustrating an amplifying element and external terminals included in the power amplifier of the high frequency module according to the embodiment 1.

The power amplifier 10 has a substantially rectangular cuboid shape and includes the amplifying element 14 and a plurality of external terminals. As the plurality of external terminals, FIG. 1 illustrates a first external terminal 11, a plurality of second external terminals 12a and 12b, and a third external terminal 13. As illustrated in FIG. 2, which will be described below, the first external terminal 11 is a terminal connected to an input terminal 15 of the amplifying element 14. The second external terminal 12a is a terminal connected to a first terminal 16 (for example, a terminal on the drain side) of the amplifying element 14. The second external terminal 12b is a terminal connected to a second terminal 17 (for example, a terminal on the source side) of the amplifying element 14. The third external terminal 13 is a terminal connected to an output terminal 18 of the amplifying element 14.

These external terminals are electrodes grown by plating and contain substantially the same metallic material. The first external terminal 11, the second external terminals 12a and 12b, and the third external terminal 13 are each provided on a mounting surface 10a of the power amplifier 10. The mounting surface 10a is a surface that faces the one principal surface 20a of the substrate 20 when the power amplifier 10 is mounted on the substrate 20.

In the high frequency module 1, the first external terminal 11 is connected to the first land electrode 21, the second external terminal 12a is connected to the second land electrode 22a, the second external terminal 12b is connected to the second land electrode 22b, and the third external terminal 13 is connected to the third land electrode 23.

FIG. 2 is a circuit diagram illustrating the amplifying element 14 and the external terminals included in the power amplifier 10. In actual power amplifier 10, a plurality of amplifying elements, a plurality of filtering elements, a switch circuit, and a control circuit. However, in the present embodiment, the example in which one amplifying element 14 is provided in the power amplifier 10 is described.

The amplifying element 14 includes the input terminal 15, the output terminal 18, the first terminal 16, and the second terminal 17. The amplifying element 14 amplifies a high frequency signal inputted to the input terminal 15 and outputs to the output terminal 18. Further, in the amplifying element 14, a current flowing between the first terminal 16 and the second terminal 17 is controlled by a bias voltage applied to the amplifying element 14.

The amplifying element 14 is, for example, a field-effect transistor. The input terminal 15 is a terminal on the gate side of the field-effect transistor, the first terminal 16 is a terminal on the drain side of the field-effect transistor, and the second terminal 17 is a terminal on the source side of the field-effect transistor. Alternatively, the amplifying element 14 may be a bipolar transistor. In this case, the input terminal 15 is a terminal on the base side of the bipolar transistor, the first terminal 16 is a terminal on the collector side of the bipolar transistor, and the second terminal 17 is a terminal on the emitter side of the bipolar transistor.

The input terminal 15 of the amplifying element 14 is connected to the first external terminal 11 via a wiring line L. The first terminal 16 and the second terminal 17 are connected to the second external terminals 12a and 12b via wiring lines L, respectively. The output terminal 18 is connected to the third external terminal 13 via a wiring line L. Each wiring line L is a metal wiring line formed inside the power amplifier 10.

A large current flows through the first terminal 16 and the second terminal 17 of the amplifying element 14 because of the amplifying operation of the amplifying element 14, and thus heat is likely to be generated near the first terminal 16 and the second terminal 17. Accordingly, it is desirable that the second external terminals 12a and 12b respectively connected to the first terminal 16 and the second terminal 17 have higher heat dissipation capability compared with the first external terminal 11 connected to the input terminal 15. Further, a signal whose power has been amplified is outputted to the output terminal 18 of the amplifying element 14, and thus heat is likely to be generated near the output terminal 18. Accordingly, it is desirable that the third external terminal 13 connected to the output terminal 18 has higher heat dissipation capability compared with the first external terminal 11 connected to the input terminal 15.

Figure 3A:
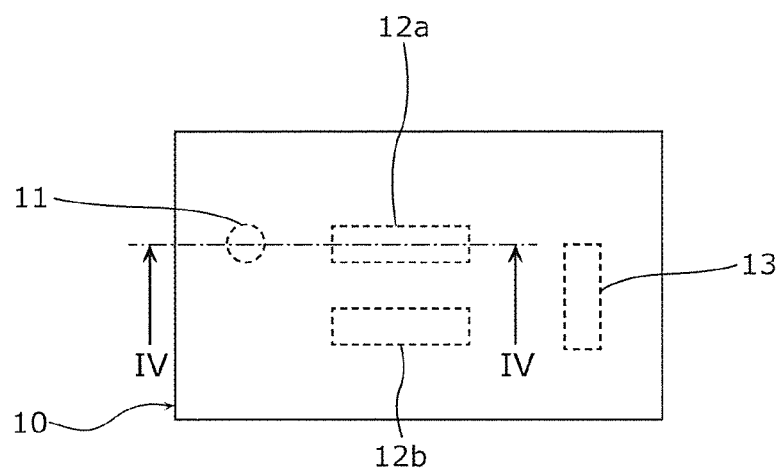
FIG. 3A is a view of the power amplifier of the high frequency module according to the embodiment 1 when viewed from a direction vertical to a mounting surface.

FIG. 3A is a view of the power amplifier 10 when viewed from a direction vertical to the mounting surface 10a.

As illustrated in FIG. 3A, when the power amplifier 10 is viewed from the direction vertical to the mounting surface 10a, the areas of the second external terminals 12a and 12b and the area of the third external terminal 13 are each larger than the area of the first external terminal 11. For example, the areas of the second external terminals 12a and 12b and the area of the third external terminal 13 are each equal to or larger than about 1.5 times the area of the first external terminal 11 but equal to or less than about 3 times the area of the first external terminal 11.

Further, similarly, when the power amplifier 10 is viewed from the direction vertical to the mounting surface 10a, the first external terminal 11 has a substantially circular shape, the second external terminals 12a and 12b each have a substantially rectangular shape, and the third external terminal 13 has a substantially elliptic shape or a substantially rectangular shape. For example, the dimension of the long side of the second external terminal 12a is larger than the dimension of the diameter of the first external terminal 11, and the dimension of the short side of the second external terminal 12a is substantially equal to the dimension of the diameter of the first external terminal 11. For example, the diameter of the first external terminal 11 is about 75 μm, the short side of the second external terminal 12a is about 75 μm, and the long side of the second external terminal 12a is about 150 μm.

As described above, when the power amplifier 10 is viewed from the direction vertical to the mounting surface 10a, the areas of the second external terminals 12a and 12b and the area of the third external terminal 13 are each made larger than the area of the first external terminal 11. This enables to increase the heat dissipation capability for heat generated at the power amplifier 10.

From the viewpoint of heat dissipation capability, it is preferable to enlarge the areas of all the external terminals. However, when the areas of all the external terminals are made larger, the total area of the power amplifier 10 becomes larger. Accordingly, in the present embodiment, the area of each of the external terminals connected to the first terminal 16, the second terminal 17, and the output terminal 18, which are close to heat generation sources, are made larger than the area of the external terminal connected to the input terminal 15.

Similarly, from the viewpoint of heat dissipation capability, it is preferable that the second land electrodes 22a and 22b connected to the second external terminals 12a and 12b and the third land electrode 23 connected to the third external terminal 13 each have higher heat receiving capability compared with the first land electrode 21 connected to the first external terminal 11.

Figure 3B:
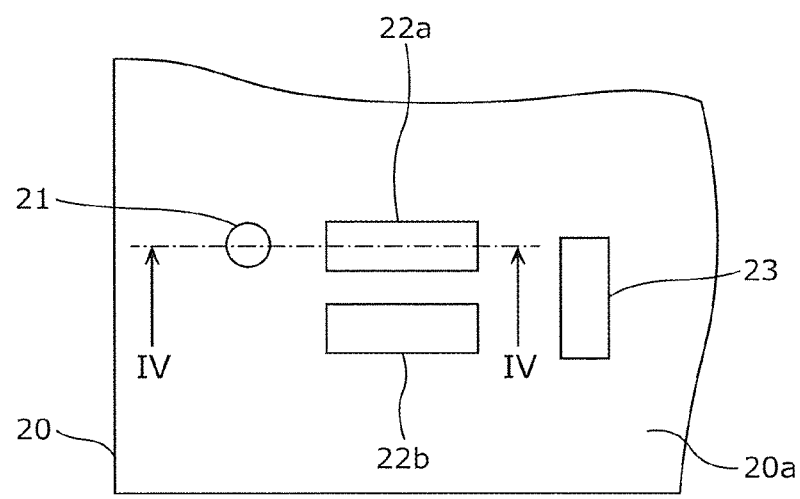
FIG. 3B is a view of the substrate of the high frequency module according to the embodiment 1 when viewed from a direction vertical to one principal surface of the substrate.

FIG. 3B is a view of the substrate 20 when viewed from a direction vertical to the one principal surface 20a.

As illustrated in FIG. 3B, when the substrate 20 is viewed from the direction vertical to the one principal surface 20a, the areas of the second land electrodes 22a and 22b and the area of the third land electrode 23 are each larger than the area of the first land electrode 21. For example, the areas of the second land electrodes 22a and 22b and the area of the third land electrode 23 are each equal to or larger than about 1.5 times the area of the first land electrode 21 but equal to or less than about 3 times the area of the first land electrode 21.

Further, similarly, when the substrate 20 is viewed from the direction vertical to the one principal surface 20a, the first land electrode 21 has a substantially circular shape, the second land electrodes 22a and 22b each have a substantially rectangular shape, and the third land electrode 23 has a substantially elliptic shape or a substantially rectangular shape. For example, the dimension of the long side of the second land electrode 22a is larger than the dimension of the diameter of the first land electrode 21, and the dimension of the short side of the second land electrode 22a is substantially equal to the dimension of the diameter of the first land electrode 21. For example, the diameter of the first land electrode 21 is about 90 μm, the short side of the second land electrode 22a is about 90 μm, and the long side of the second land electrode 22a is about 180 μm.

As described above, when the substrate 20 is viewed from the direction vertical to the one principal surface 20a, the areas of the second land electrodes 22a and 22b and the area of the third land electrode 23 are each made larger than the area of the first land electrode 21. This enables to increase the heat receiving capability to the heat generated at the power amplifier 10.

Figure 4A:
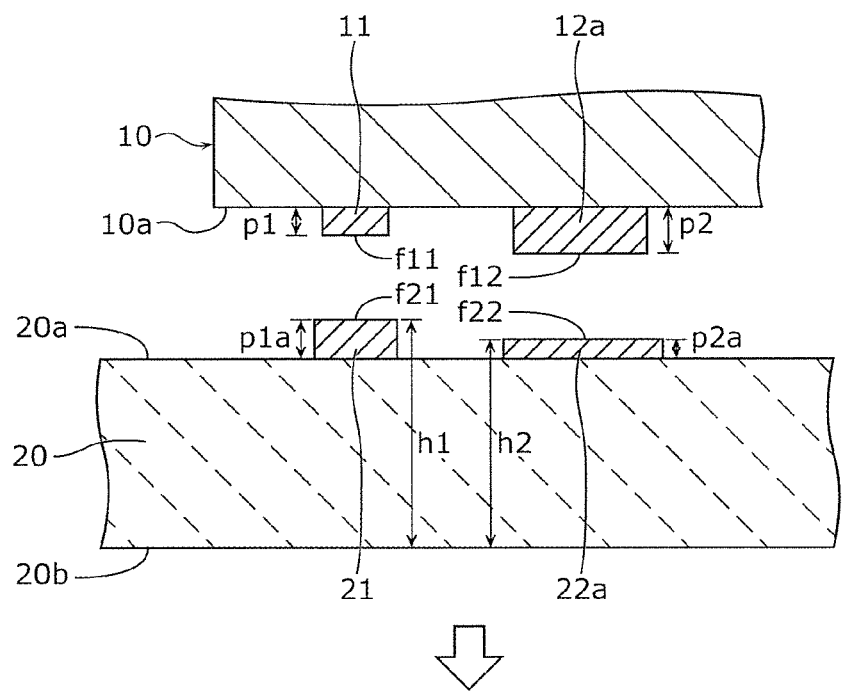
FIG. 4A and FIG. 4B are cross-sectional views of the high frequency module according to the embodiment 1 cut at line IV-IV illustrated in FIG. 1, illustrating a state before the power amplifier is mounted on the substrate and a state where the power amplifier is mounted on the substrate, respectively.
Figure 4B:
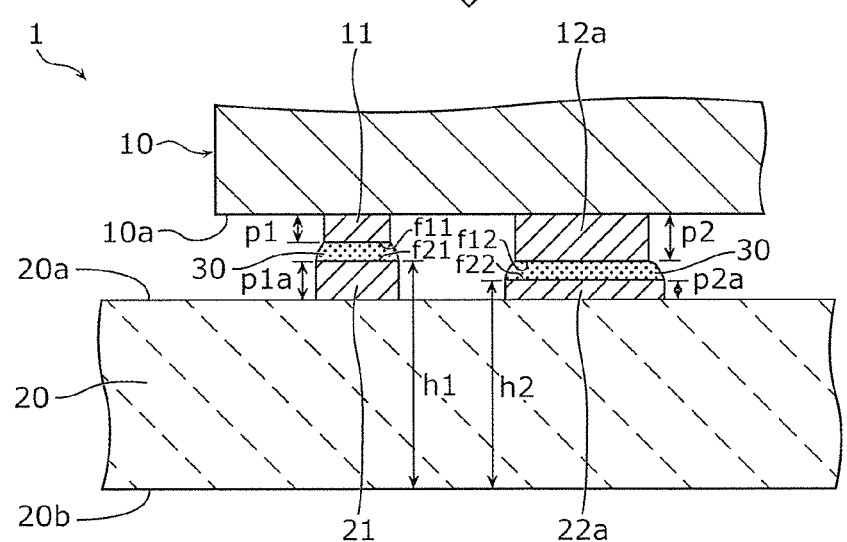

FIG. 4A and FIG. 4B are cross-sectional views of the high frequency module 1 cut at line IV-IV illustrated in FIG. 1. FIG. 4A is a diagram illustrating the state before the power amplifier 10 is mounted on the substrate 20. FIG. 4B is a diagram illustrating the state where the power amplifier 10 is mounted on the substrate 20.

Here, in this section, of the plurality of external terminals, the description is provided while focusing on the first external terminal 11 and the second external terminal 12a. Further, of the plurality of land electrodes, the description is provided while focusing on the first land electrode 21 and the second land electrode 22a. The second external terminal 12b and the second external terminal 12a have substantially the same configuration, and the second land electrode 22b and the second land electrode 22a have substantially the same configuration. Therefore, the descriptions thereof are omitted. The third external terminal 13 and the third land electrode 23 will be described later.

As illustrated in FIG. 4A, the first external terminal 11 and the second external terminal 12a are protruding from the mounting surface 10a toward the substrate 20 side. A flat connection surface f11 is formed at a protruded top-end portion of the first external terminal 11, and a flat connection surface f12 is formed at a protruded top-end portion of the second external terminal 12a. The connection surfaces f11 and f12 are each a surface to be connected to the land electrode of the substrate 20 when the power amplifier 10 is mounted on the substrate 20.

A distance P1 from the mounting surface 10a to the connection surface f11 of the first external terminal 11 is shorter than a distance p2 from the mounting surface 10a to the connection surface f12 of the second external terminal 12a. The difference between the distances p1 and p2 is linked with the areas of the external terminals when the power amplifier 10 is viewed from the direction vertical to the mounting surface 10a. For example, the larger the area of the external terminal is, the longer the foregoing distance becomes. In the present embodiment, the area of the first external terminal 11 is smaller than the area of the second external terminal 12a when viewed from the direction vertical to the mounting surface 10a, and thus the following inequality holds: distance p1<distance p2. The difference between the distances p1 and p2 is, for example, between about 2 μm and about 4 μm inclusive.

As described above, the first external terminal 11 and the second external terminal 12a of the power amplifier 10 have different heights. If the power amplifier 10 were mounted in this state, the failure of the mounting would be likely to occur. Because of this, in the present embodiment, the substrate 20 has a characteristic structure illustrated below.

As illustrated in FIG. 4A, the first land electrode 21 and the second land electrode 22a include flat connection surfaces f21 and f22 that face the mounting surface 10a, respectively. The connection surfaces f21 and f22 are each a surface to be connected to the external terminal of the power amplifier 10 when the power amplifier 10 is mounted on the substrate 20. The first land electrode 21 and the second land electrode 22a are formed by plating and the like and protrude by the thickness of the electrode from the one principal surface 20a toward the power amplifier 10 side. In the present embodiment, a distance P1a from the connection surface f21 of the first land electrode 21 to the one principal surface 20a is longer than a distance p2a from the connection surface f22 of the second land electrode 22a to the one principal surface 20a (distance p1a>distance p2a). In other words, a distance h1 from the other principal surface 20b of the substrate 20 to the connection surface f21 of the first land electrode 21 is longer than a distance h2 from the other principal surface 20b to the connection surface f22 of the second land electrode 22a (distance h1>distance h2). The difference between the distances h1 and h2 is, for example, between about 2 μm and about 4 μm inclusive. That is to say, in the case where a predetermined plane is used as a reference, the height of the first land electrode 21 is higher than the height of the second land electrode 22. The connection surface f21 is positioned closer to the mounting surface 10a than the connection surface f22.

As illustrated in FIG. 4B, the first external terminal 11 is connected to the first land electrode 21, and the second external terminal 12a is connected to the second land electrode 22a. Specifically, the connection surface f11 of the first external terminal 11 is connected to the connection surface f21 of the first land electrode 21 using a joining material 30, and the connection surface f12 of the second external terminal 12a is connected to the connection surface f22 of the second land electrode 22a using the joining material 30.

As described above, the high frequency module 1 of the present embodiment includes the power amplifier 10 and the substrate 20 on which the power amplifier 10 is mounted. The power amplifier 10 includes the mounting surface 10a, the first external terminal 11, and the second external terminals (for example, the second external terminal 12a), and the first external terminal 11 and the second external terminals are formed on the mounting surface 10a. The substrate 20 includes the one principal surface 20a, the first land electrode 21, and the second land electrodes (for example, the second land electrode 22a), and the first land electrode 21 and the second land electrodes are formed on the one principal surface 20a. The first external terminal 11 is connected to the first land electrode 21, and the second external terminal 12a is connected to the second land electrode 22a. The distance P1 from the mounting surface 10a to the connection surface f11 of the first external terminal 11 is shorter than the distance p2 from the mounting surface 10a to the connection surface f12 of the second external terminal 12a, and the distance p1a from the connection surface f21 of the first land electrode 21 to the one principal surface 20a is longer than the distance p2a from the connection surface f22 of the second land electrode 22a to the one principal surface 20a.

That is to say, in the present embodiment, the relationship between the distance p1 from the mounting surface 10a to the connection surface f11 of the first external terminal 11 and the distance p2 from the mounting surface 10a to the connection surface f12 of the second external terminal 12a is such that the distance p1<the distance p2, whereas the relationship between the distance P1a from the connection surface f21 of the first land electrode 21 to the one principal surface 20a and the distance p2a from the connection surface f22 of the second land electrode 22a to the one principal surface 20a is such that the distance p1a>the distance p2a.

This enables to reduce the difference between the distance between the connection surfaces f11 and f21 and the distance between the connection surfaces f12 and f22, and enables to suppress the occurrence of connection failure, that is, failure of the mounting, at the time of mounting the power amplifier 10 on the substrate 20.

Figure 5:
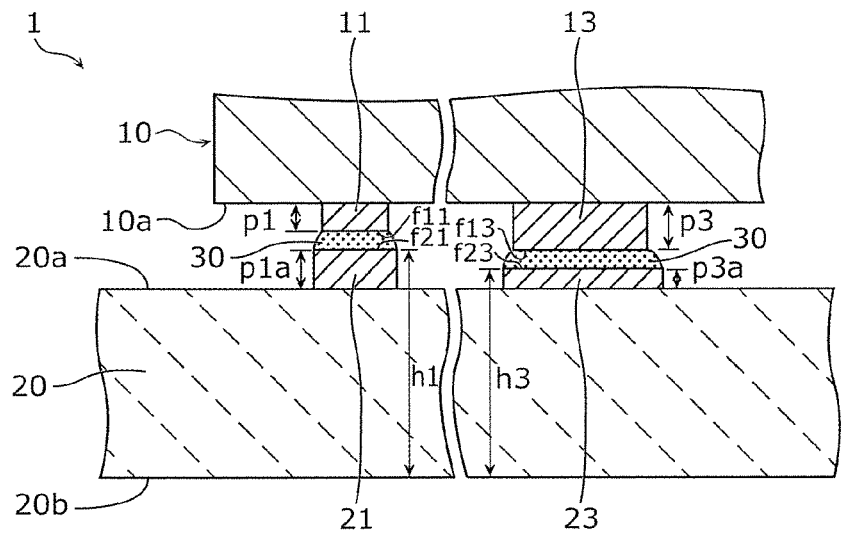
FIG. 5 is a diagram illustrating another example of the high frequency module according to the embodiment 1 in the state where the power amplifier is mounted on the substrate.

Next, the third external terminal 13 and the third land electrode 23 are described with reference to FIG. 5. FIG. 5 is a diagram illustrating another example of the state where the power amplifier 10 is mounted on the substrate 20.

As illustrated in FIG. 5, the third external terminal 13 is protruding from the mounting surface 10a toward the substrate 20 side. A flat connection surface f13 is formed at a protruded top-end portion of the third external terminal 13. A distance P3 from the mounting surface 10a to the connection surface f13 of the third external terminal 13 is longer than the distance p1 from the mounting surface 10a to the connection surface f11 of the first external terminal 11 (distance p1<distance p3).

The third land electrode 23 includes a flat connection surface f23 that faces the mounting surface 10a. A distance P3a from the connection surface f23 of the third land electrode 23 to the one principal surface 20a is shorter than the distance p1a from the connection surface f21 of the first land electrode 21 to the one principal surface 20a (distance p1a>distance p3a). In other words, a distance h3 from the other principal surface 20b of the substrate 20 to the connection surface f23 of the third land electrode 23 is shorter than a distance h1 from the other principal surface 20b to the connection surface f21 of the first land electrode 21 (distance h1>distance h3). That is to say, in the case where a predetermined plane is used as a reference, the height of the third land electrode 23 is lower than the height of the first land electrode 21. The connection surface f13 of the third external terminal 13 is connected to the connection surface f23 of the third land electrode 23 using the joining material 30.

In the present embodiment, the relationship between the distance P1 from the mounting surface 10a to the connection surface f11 of the first external terminal 11 and the distance p3 from the mounting surface 10a to the connection surface f13 of the third external terminal 13 is such that the distance p1<the distance p3, whereas the relationship between the distance P1a from the connection surface f21 of the first land electrode 21 to the one principal surface 20a and the distance p3a from the connection surface f23 of the third land electrode 23 to the one principal surface 20a is such that the distance p1a>the distance p3a. This enables to reduce the difference between the distance between the connection surfaces f11 and f21 and the distance between the connection surfaces f13 and f23, and enables to suppress the occurrence of connection failure, that is, failure of the mounting, at the time of mounting the power amplifier 10 on the substrate 20.

1-2. Fabrication Method of External Terminal and Land Electrode

Next, a fabrication method of the external terminals of the power amplifier 10 and a fabrication method of the land electrodes of the substrate 20 are described. Here, the description is provided while focusing on the first external terminal 11 and the second external terminal 12a of the plurality of external terminals. Further, the description is provided while focusing on the first land electrode 21 and the second land electrode 22a of the plurality of land electrodes.

FIGS. 6A to 6D are diagrams illustrating a fabrication method of the external terminals of the power amplifier 10.

Figure 6A:
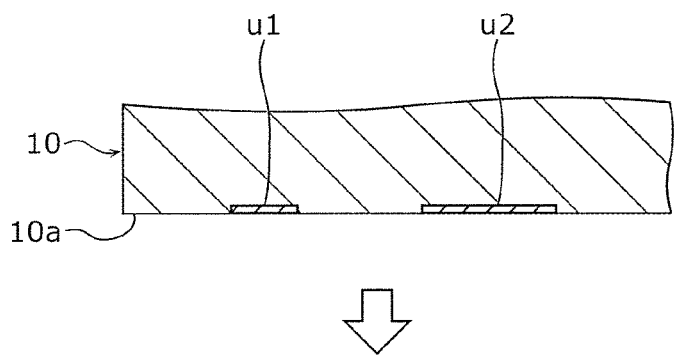
FIG. 6A and FIG. 6B are diagrams illustrating a fabrication method of external terminals of the power amplifier in the high frequency module according to the embodiment 1.

First, as illustrated in FIG. 6A, the power amplifier 10 in which the external terminals have not been formed yet is prepared. The power amplifier 10 includes the amplifying element 14 therein, and on this power amplifier 10, underlayer electrodes u1 and u2 are formed for forming the external terminals. Each of the underlayer electrodes u1 and u2 are formed by, for example, depositing a Ti layer and a Cu layer in this order using a sputter. The underlayer electrode u1 is connected to the input terminal 15 of the amplifying element 14 via the wiring line L, and the underlayer electrode u2 is connected to the first terminal 16 via the wiring line L.

Figure 6B:
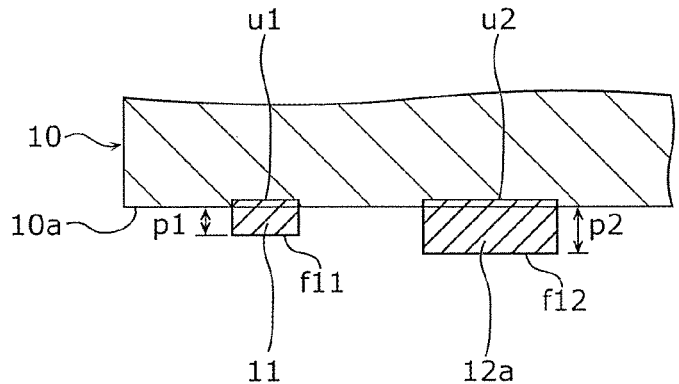

Next, as illustrated in FIG. 6B, the first external terminal 11 corresponding to the underlayer electrode u1 is formed, and the second external terminal 12a corresponding to the underlayer electrode u2 is formed. These first external terminal 11 and second external terminal 12a are, for example, Cu pillars, and are formed using the underlayer electrodes u1 and u2 as seed electrodes and grown by plating. At the time of plating growth, the plating is performed after masking the area other than the underlayer electrodes u1 and u2. As described above, the area of the first external terminal 11 is smaller than the area of the second external terminal 12a when viewed from the direction vertical to the mounting surface 10a, and therefore, after the plating growth, the following inequality holds: distance p1<distance p2.

FIGS. 7A to 7D are diagrams illustrating a fabrication method of the land electrodes of the substrate 20.

First, as illustrated in FIG. 7A, the substrate 20 is formed using a semiconductor process, and the land electrodes are formed on the one principal surface 20a of the substrate 20. In FIG. 7A, as the land electrodes, an electrode layer 21a that is a part of the first land electrode 21 and the second land electrode 22a are illustrated. The electrode layer 21a and the second land electrode 22a are each formed by, for example, Cu plating. The thicknesses of the electrode layer 21a and the second land electrode 22a formed on the substrate 20 are substantially the same.

Next, as illustrated in FIG. 7B, a resist mask 51 is formed on the area other than the electrode layer 21a. Next, as illustrated in FIG. 7C, an electrode layer 21b is deposited on the exposed electrode layer 21a. This electrode layer 21b is formed by allowing Cu to grow by plating using the electrode layer 21a as a seed electrode.

Next, as illustrated in FIG. 7D, the resist mask 51 is removed. This allows to form the first land electrode 21 and the second land electrode 22a. The first land electrode 21 is formed of two layers, the electrode layers 21a and 21b, and includes a larger number of layers than that of the second land electrode 22a. The height of the first land electrode 21 is higher than the height of the second land electrode 22a, and the following inequality holds: distance p1a>distance p2a (distance h1>distance h2).

In the present embodiment, in order to suppress the occurrence of failure of the mounting, the height of the land electrode of the substrate 20 is varied depending on the height of the external terminal of the power amplifier 10. This enables to suppress the failure of the mounting at the time of mounting the power amplifier 10 on the substrate 20.

For example, as in the related art, it is conceivable to use a method in which the height of an external terminal having a lower height is adjusted by applying an electrically conductive paste thereto. However, in such a case, a highly accurate facility is required to perform the position adjustment of a plurality of power amplifiers and the position adjustment of a plurality of external terminals. In the fabrication method of the land electrodes according to the present embodiment, the semiconductor process at the time of fabricating the substrate 20 is used, and a large number of the land electrodes can be formed together. This enables to efficiently form the first land electrode 21 having a higher height with a high degree of accuracy.

Modification Example of Embodiment 1

Figure 8:
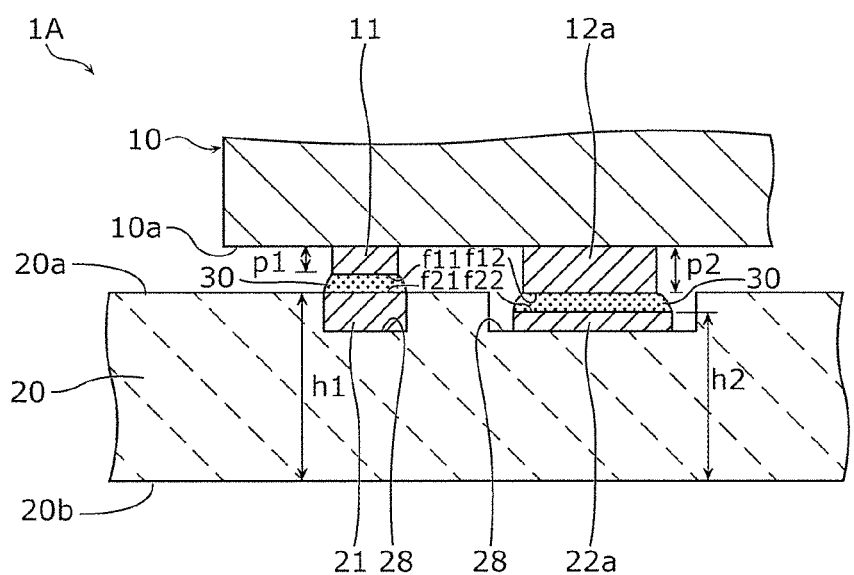
FIG. 8 is a cross-sectional view of a high frequency module according to a modification example of the embodiment 1.

FIG. 8 is a cross-sectional view of a high frequency module 1A according to a modification example of the embodiment 1. In the high frequency module 1A of the modification example, the first land electrode 21 and the second land electrode 22a are each formed on a depression 28 of the substrate 20.

In this modification example, the relationship between the first external terminal 11 and the second external terminal 12a is such that the distance p1<the distance p2, whereas the relationship between the first land electrode 21 and the second land electrode 22a is such that the distance p1a>the distance p2a (distance h1>distance h2). That is to say, the connection surface f21 is positioned closer to the mounting surface 10a than the connection surface f22. This enables to reduce the difference between the distance between the connection surfaces f11 and f21 and the distance between the connection surfaces f12 and f22, and enables to suppress the occurrence of failure of the mounting at the time of mounting the power amplifier 10 on the substrate 20.

Embodiment 2

Figure 9A:
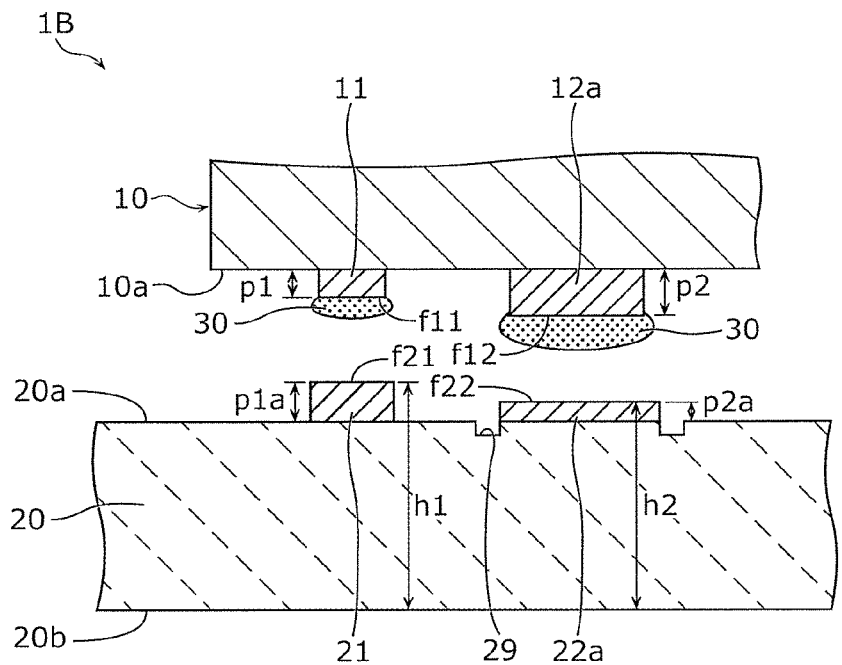
FIG. 9A and FIG. 9B are cross-sectional views of a high frequency module according to an embodiment 2.
Figure 9B:
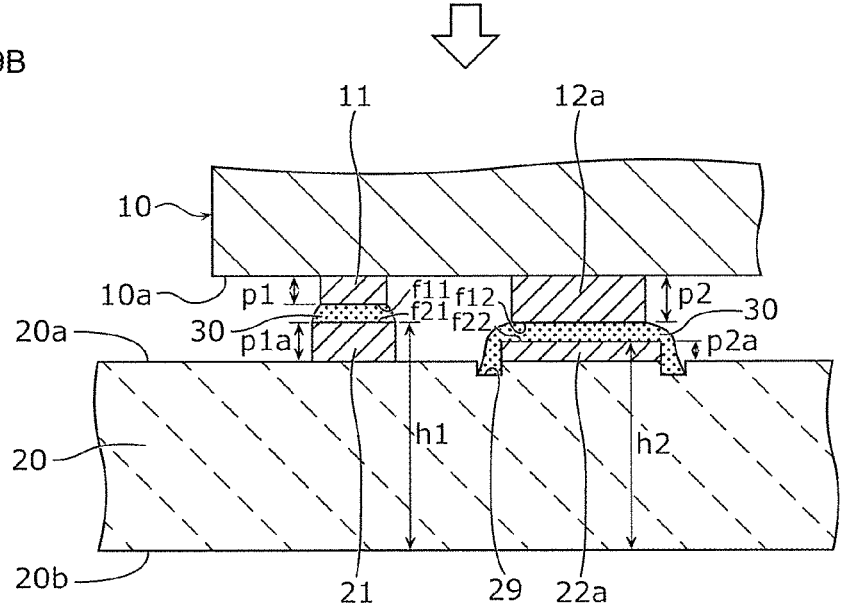

FIG. 9A and FIG. 9B are cross-sectional views of a high frequency module 1B according to the embodiment 2. In the high frequency module 1B of the embodiment 2, a groove-like depression 29 is formed along an outer perimeter of the second land electrode 22a of the substrate 20.

FIG. 9A is a diagram illustrating the state before the power amplifier 10 is mounted on the substrate 20, and FIG. 9B is a diagram illustrating the state where the power amplifier 10 is mounted on the substrate 20.

For example, in the method in which the power amplifier 10 is mounted on the substrate 20 after transferring the joining material 30 to the external terminal, when the height of the second external terminal 12a is higher than the height of the first external terminal 11, a larger amount of the joining material 30 is attached to the second external terminal 12a at the time of transferring the joining material 30, as illustrated in FIG. 9A. Accordingly, after the mounting, the joining material 30 wets and spreads over the substrate 20 more than necessary, and may be connected to an adjacent external terminal.

In the embodiment 2, the groove-like depression 29 is formed along the outer perimeter of the second land electrode 22a of the substrate 20. Therefore, as illustrated in FIG. 9B, an excessive amount of the joining material 30 at the time of mounting can be kept within the depression 29. This enables to prevent the joining material 30, which connects the second external terminal 12a and the second land electrode 22a, from being connected with an adjacent external terminal.

Modification Example of Embodiment 2

Figure 10:
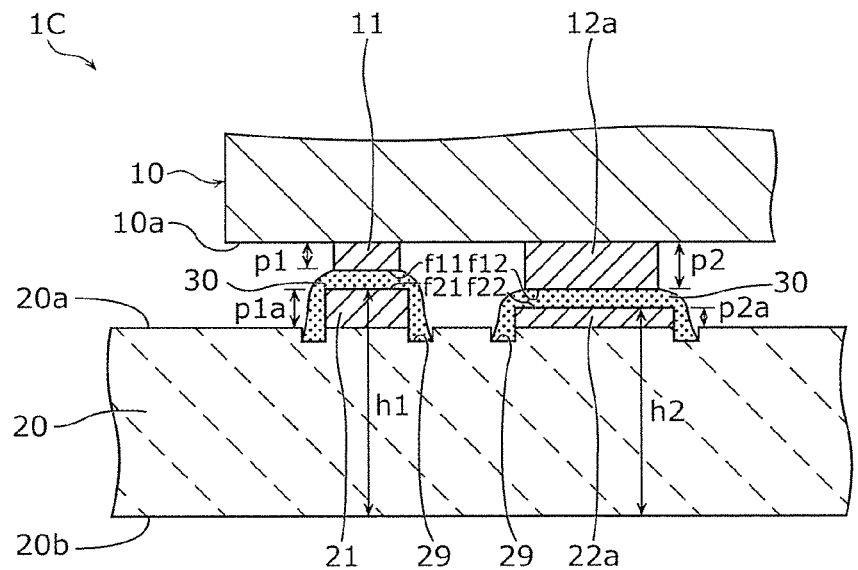
FIG. 10 is a cross-sectional view of a high frequency module according to a modification example of the embodiment 2.

FIG. 10 is a cross-sectional view of a high frequency module 1C according to a modification example of the embodiment 2. In the high frequency module 1C according to the modification example of the embodiment 2, a groove-like depression 29 is formed along an outer perimeter of the first land electrode 21 of the substrate 20.

In this modification example, the groove-like depression 29 is formed along the outer perimeter of the first land electrode 21 of the substrate 20. Therefore, as illustrated in FIG. 10, an excessive amount of the joining material 30 at the time of mounting can be kept within the depression 29. This enables to prevent the joining material 30, which connects the first external terminal 11 and the first land electrode 21, from being connected with an adjacent external terminal.

Further, because the groove-like depression 29 is formed along the outer perimeter of the second land electrode 22a, an excessive amount of the joining material 30 at the time of mounting can be kept within the depression 29. This enables to prevent the joining material 30, which connects the second external terminal 12a and the second land electrode 22a, from being connected with an adjacent external terminal.

Embodiment 3

Figure 11:
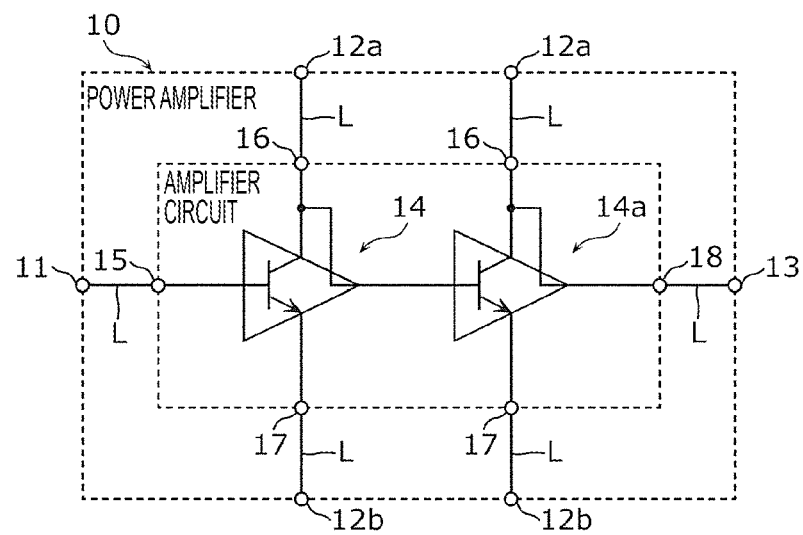
FIG. 11 is a circuit diagram illustrating an amplifier circuit and external terminals included in a power amplifier of a high frequency module according to an embodiment 3.

A power amplifier 10 of a high frequency module according to the embodiment 3 includes an amplifier circuit made up of a plurality of amplifying elements. FIG. 11 is a circuit diagram illustrating an amplifier circuit and external terminals included in the power amplifier 10.

The power amplifier 10 includes an early-stage amplifying element 14, a later-stage amplifying element 14a, and a plurality of external terminals. In FIG. 11, as the plurality of external terminals, a first external terminal 11, two second external terminals 12a, two second external terminals 12b, and a third external terminal 13 are illustrated.

The early-stage amplifying element 14 includes an input terminal 15, a first terminal 16, and a second terminal 17. The amplifying element 14 amplifies a high frequency signal inputted to the input terminal 15 and outputs to the later-stage amplifying element 14a. In the amplifying element 14, a current flowing between the first terminal 16 and the second terminal 17 is controlled by a bias voltage applied to the amplifying element 14.

The later-stage amplifying element 14a includes an output terminal 18, a first terminal 16, and a second terminal 17. The amplifying element 14a receives a signal outputted from the amplifying element 14, further amplifies the signal, and outputs to the output terminal 18. In the amplifying element 14a, a current flowing between the first terminal 16 and the second terminal 17 is controlled by a bias voltage applied to the amplifying element 14a.

The input terminal 15 of the amplifying element 14 is connected to the first external terminal 11 via a wiring line L. The first terminal 16 and the second terminal 17 of the amplifying element 14 are connected to the second external terminals 12a and 12b via the corresponding wiring lines L, respectively. The output side of the amplifying element 14 is connected to the gate side of the amplifying element 14a via a wiring line inside the amplifier circuit.

The first terminal 16 and the second terminal 17 of the amplifying element 14a are connected to the second external terminals 12a and 12b, which are different from the external terminals connected to the amplifying element 14, via the corresponding wiring lines L, respectively. The output terminal 18 of the amplifying element 14a is connected to the third external terminal 13 via a wiring line L.

Further, in the high frequency module of the embodiment 3, when the power amplifier 10 is viewed from the direction vertical to the mounting surface 10a, the areas of the plurality of the second external terminals 12a and 12b and the area of the third external terminal 13 are each made larger than the area of the first external terminal 11. This enables to increase the heat dissipation capability for the heat generated at the power amplifier 10. Further, when the substrate 20 is viewed from the direction vertical to the one principal surface 20a, the area of the plurality of the second land electrode 22a, 22b or the area of the third land electrode 23 is made larger than the area of the first land electrode 21. This enables to increase the heat receiving capability for the heat generated at the power amplifier 10.

Further, in the high frequency module of the embodiment 3, when focused on the first external terminal 11 and the second external terminal 12a and focused on the first land electrode 21 and the second land electrode 22a, the relationship between the first external terminal 11 and the second external terminal 12a is such that the distance p1<the distance p2, whereas the relationship between the first land electrode 21 and the second land electrode 22a is such that the distance p1a>the distance p2a (distance h1>distance h2). This enables to reduce the difference between the distance between the connection surfaces f11 and f21 and the distance between the connection surfaces f12 and f22, and enables to suppress the occurrence of failure of the mounting at the time of mounting the power amplifier 10 on the substrate 20.

Other Embodiments

Although the high frequency modules according to the present disclosure have been described above based on each of the embodiments, the present disclosure is not limited to these embodiments. Embodiments obtained by applying various modifications apparent to those skilled in the art to the embodiments and other embodiments formed by combining some of constituting elements of different embodiments may be included in the scope of the present disclosure as long as they do not depart from the scope of the present disclosure.

For example, the power amplifier 10 may include, in addition to the plurality of amplifying elements, a filtering element, an inductive element, a capacitive element, a switch circuit, a control circuit, and the like.

For example, the substrate 20 is not limited to a substrate formed by photolithography and may alternatively be a low temperature co-fired ceramics (LTCC) substrate.

For example, the shapes of the connection surfaces f11 and f12 of the embodiment 1 are not limited to a flat-shape, and may alternatively be a curved surface shape. In the case where the connection surfaces f11 and f12 each have a curved surface shape, the positions on the respective curved surfaces that are furthest away from the mounting surface 10a may be defined as the distance p1 and the distance p2 from the mounting surface 10a, respectively.

For example, in the embodiment 1, as an exemplary shape of the external terminal or the land electrode, a circular shape is mentioned, and this circular shape includes an elliptic shape. Further, as an exemplary shape of the external terminal or the land electrode, a rectangular shape is mentioned, and a corner of this rectangular shape may be rounded.

Further, in the embodiment 3, in the case where a current flowing through the first terminal 16 and the second terminal 17 of the early-stage amplifying element 14 is small, the areas of the second external terminals connected to the first terminal 16 and the second terminal 17 of the early-stage amplifying element 14 may be made smaller than the areas of the second external terminals connected to the first terminal 16 and the second terminal 17 of the later-stage amplifying element 14a.

Further, in the embodiment 1, the example of single-sided mounting is illustrated in which the power amplifier 10 is mounted on the one principal surface 20a of the substrate 20. However, the example is not limited thereto, and a double-sided mounting in which the power amplifier 10 is mounted on both the principal surfaces (the one principal surface 20a and the other principal surface 20b) of the substrate 20 may also be used.

The present disclosure can be used for communication devices and the like as high frequency modules capable of suppressing the occurrence of failure of the mounting.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high frequency module comprising:
   a power amplifier; and
   a substrate on which the power amplifier is mounted, wherein
   the power amplifier includes a mounting surface, a first external terminal, and at least one second external terminal, the first external terminal and the at least one second external terminal being provided on the mounting surface,
   the substrate includes one principal surface, a first land electrode, and a second land electrode, the first land electrode and the second land electrode being provided on the one principal surface,
   the first external terminal is connected to the first land electrode,
   the at least one second external terminal is connected to the second land electrode,
   the first external terminal is protruded from the mounting surface toward the substrate to have a first flat external terminal connection surface at a protruded top-end portion,
   the at least one second external terminal is protruded from the mounting surface toward the substrate to have at least one second flat external terminal connection surface at a protruded top-end portion,
   the first land electrode includes a first land electrode connection surface facing the first external terminal connection surface, and the second land electrode includes a second land electrode connection surface facing the second external terminal connection surface,
   when the power amplifier is viewed from a direction vertical to the mounting surface, an area of each of the at least one second flat external terminal connection surface is larger than an area of the first flat external terminal connection surface,
   a distance from the mounting surface to the first flat external terminal connection surface is shorter than a distance from the mounting surface to each of the at least one second flat external terminal connection surface,
   a distance from the first land electrode connection surface to the one principal surface is longer than a distance from the second land electrode connection surface to the one principal surface, and
   at least a part of surfaces of each of the first external terminal and the at least one second external terminal is exposed to spaces between the power amplifier and the substrate.

2. The high frequency module according to claim 1, wherein
   when the power amplifier is viewed from a direction vertical to the mounting surface, the at least one second external terminal has a rectangular shape, and the first external terminal has a circular shape.

3. The high frequency module according to claim 2, wherein
   when the power amplifier is viewed from a direction vertical to the mounting surface, a dimension of a long side of the at least one second external terminal is larger than a dimension of a diameter of the first external terminal, and a dimension of a short side of the at least one second external terminal is equal to the dimension of the diameter of the first external terminal.

4. The high frequency module according to claim 2, wherein
   the first external terminal and the at least one second external terminal are electrodes grown by plating and contain a same metallic material.

5. The high frequency module according to claim 1, wherein
   the first external terminal and the at least one second external terminal are electrodes grown by plating and contain a same metallic material.

6. The high frequency module according to claim 1, wherein
   when the substrate is viewed from a direction vertical to the one principal surface, an area of the second land electrode is larger than an area of the first land electrode.

7. The high frequency module according to claim 6, wherein
   when the substrate is viewed from a direction vertical to the one principal surface, the second land electrode has a rectangular shape, and the first land electrode has a circular shape.

8. The high frequency module according to claim 1, wherein
   each of the first land electrode and the second land electrode includes one or more layers of electrodes, and a number of layers included in the first land electrode is larger than a number of layers included in the second land electrode.

9. The high frequency module according to claim 1, wherein
   the substrate is comprised of an ultraviolet curable material or a light curable material.

10. The high frequency module according to claim 1, wherein
    the power amplifier includes one or more amplifying elements,
    each of the one or more amplifying elements includes
       an input terminal to which a high frequency signal is inputted,
       an output terminal from which the high frequency signal is outputted,
       a first terminal, and
       a second terminal,
    the amplifying element is configured to
       amplify a high frequency signal inputted to the input terminal and outputs an amplified high frequency signal to the output terminal, and control a current flowing between the first terminal and the second terminal using a bias voltage applied to the amplifying element, at least one of one or more of the input terminals included in the one or more amplifying elements is connected to the first external terminal via a wiring line inside the power amplifier, the at least one second external terminal includes a plurality of second external terminals, and the first terminal and the second terminal are connected to the plurality of second external terminals via wiring lines inside the power amplifier, respectively.

11. The high frequency module according to claim 10, wherein the amplifying element is a field-effect transistor, the input terminal is a terminal on a gate side of the field-effect transistor, the first terminal is a terminal on a drain side of the field-effect transistor, and the second terminal is a terminal on a source side of the field-effect transistor.

12. The high frequency module according to claim 10, wherein the amplifying element is a bipolar transistor, the input terminal is a terminal on a base side of the bipolar transistor, the first terminal is a terminal on a collector side of the bipolar transistor, and the second terminal is a terminal on an emitter side of the bipolar transistor.

13. The high frequency module according to claim 10, wherein the power amplifier further includes at least one third external terminal provided on the mounting surface facing the substrate, at least one of one or more of the output terminals included in the one or more amplifying elements is connected to the third external terminal via a wiring line inside the power amplifier, the substrate further includes at least one third land electrode provided on the one principal surface of the substrate, the third external terminal is connected to the third land electrode, a distance from the mounting surface to a connection surface of the third external terminal is longer than a distance from the mounting surface to the first flat external terminal connection surface, and a distance from a connection surface of the third land electrode to the one principal surface is shorter than a distance from the first land electrode connection surface to the one principal surface.

14. The high frequency module according to claim 10, wherein the power amplifier further includes at least one third external terminal provided on the mounting surface that faces the substrate, at least one of one or more of the output terminals included in the one or more amplifying elements is connected to the third external terminal via a wiring line inside the power amplifier, the substrate further includes at least one third land electrode provided on the one principal surface of the substrate, the third external terminal is connected to the third land electrode, a distance from the mounting surface to a connection surface of the third external terminal is longer than a distance from the mounting surface to the first flat connection surface, and a distance from another principal surface of the substrate to a connection surface of the third land electrode is shorter than a distance from the other principal surface to the first land electrode connection surface.

15. The high frequency module according to claim 1, wherein a groove-like depression is provided along an outer perimeter of the second land electrode of the substrate.

16. The high frequency module according to claim 1, wherein a groove-like depression is provided along an outer perimeter of the first land electrode of the substrate.

17. A high frequency module comprising:

a power amplifier; and a substrate on which the power amplifier is mounted, wherein the power amplifier includes a mounting surface, a first external terminal, and at least one second external terminal, the first external terminal and the at least one second external terminal being provided on the mounting surface, the substrate includes one principal surface, a first land electrode, and a second land electrode, the first land electrode and the second land electrode being provided on the one principal surface, the first external terminal is connected to the first land electrode, the first external terminal is protruded from the mounting surface toward the substrate to have a first flat external terminal connection surface at a protruded top-end portion, the at least one second external terminal is protruded from the mounting surface toward the substrate to have at least one second flat external terminal connection surface at a protruded top-end portion, the first land electrode includes a first land electrode connection surface facing the first external terminal connection surface, and the second land electrode includes a second land electrode connection surface facing the second external terminal connection surface, when the power amplifier is viewed from a direction vertical to the mounting surface, an area of each of the at least one second flat external terminal connection surface is larger than an area of the first flat external terminal connection surface, the at least one second external terminal is connected to the second land electrode, a distance from the mounting surface to the first flat external terminal connection surface is shorter than a distance from the mounting surface to each of the at least one second flat external terminal connection surface, a distance from another principal surface of the substrate to the first land electrode connection surface is longer than a distance from the other principal surface to a-the second land electrode connection surface, and at least a part of surfaces of each of the first external terminal and the at least one second external terminal is exposed to spaces between the power amplifier and the substrate.

18. The high frequency module according to claim 17, wherein the first external terminal and the at least one second external terminal are electrodes grown by plating and contain a same metallic material.

* * * * *